United States Patent [19]

Rodriguez

[11] 4,296,331

[45] Oct. 20, 1981

[54] OPTICALLY COUPLED ELECTRIC POWER RELAY

[75] Inventor: Edward T. Rodriguez, Winchester, Mass.

[73] Assignee: Theta-Corporation, Woburn, Mass.

[21] Appl. No.: 65,072

[22] Filed: Aug. 9, 1979

[51] Int. Cl.³ .............................................. G02B 27/00
[52] U.S. Cl. ..................................... 250/551; 307/311
[58] Field of Search ................. 250/551, 227; 307/311; 357/19

[56] References Cited

U.S. PATENT DOCUMENTS

| | | | |
|---|---|---|---|
| 3,628,039 | 12/1969 | Ochs | 250/551 |
| 3,693,060 | 9/1972 | Joyce | 250/551 |
| 3,708,672 | 1/1973 | Marinkovic | 250/551 |
| 3,976,877 | 8/1976 | Thillays | 250/551 |
| 4,112,308 | 9/1978 | Olschewski et al. | 250/551 |
| 4,124,860 | 11/1978 | Johnson | 357/19 |
| 4,129,785 | 12/1978 | Kadah | 307/311 |

Primary Examiner—David C. Nelms
Attorney, Agent, or Firm—Jerry Cohen

[57] ABSTRACT

The present invention relates to power relays and more particularly to optically coupled, zero-voltage switching electric power relays. Operating from logic-level signals, the device can control loads of several amperes or more at 60–400 Hz line voltages of at least 240 VAC. The invention introduces meaningful superior performance characteristics while at the same time incorporating unique cost reduction methods.

14 Claims, 8 Drawing Figures

OPTICALLY COUPLED ELECTRIC POWER RELAY

BACKGROUND OF THE INVENTION

During the past decade, extensive development has taken place in the industry relative to solid state relays. The following references:
(1) "SCR Manual", Fifth Edition, General Electric Co., 1972.
(2) "Solid State Devices Manual", RCA Corporation, 1975.
(3) 400 Ideas for Design, Hayden Book Co., 1971.
(4) Power Switching Using Solid State Relay, Application Note AN-6141, RCA Corp., 1973.
describe many circuits involving optical coupling and zero crossing techniques associated with power-level switching techniques with methods exhibiting longer life and greater integrated circuit logic compatibility.

Prior to 1960, the most common power switching relay was understood to be basically a set of contacts which closed when subjected to the field of an adjacent electromagnet. Such a coil/contact arrangement has provided dielectric isolation between the input signal and the load.

With the 1960's and the advent of power semiconductors, it became attractive in a few highly repetitive switching applications to use the contacts not to switch the load but instead to activate a power semiconductor. The semiconductor could then offer dramatically longer life because of absence of contact arcing. Such a product created a class known still today as "hybrid relays." That is, hybrid relays use a low current, electromechanical relay (EMR) for control and isolation and a semiconductor for load switching.

In 1967, the first commercial "all solid state" relay was introduced. By removing the EMR altogether, the unit could claim an absence of moving parts and hence long life. The earliest such units from several firms typically employed an oscillator, a small transformer for isolation, and a power stage. Today, a number of firms continue to produce similar products. U.S. Pat. No. 3,648,075 describes such a unit.

In 1971, the first optically isolated solid state relays were introduced. The optical technique could offer greater isolation and a variety of subtle performance benefits. U.S. Pat. No. 3,723,769 and Solid State Relays for AC Power Control, Application Note An-755, Motorola, Inc., 1975, are representative of today's most common approach to isolation and circuit design in a solid state relay. U.S. Pat. No. 3,866,051 reflects an alternate design in which part of the zero-crossing detector is moved over to the input side of the relay. These fall into a second major class we can call optically coupled zero-crossover power relays. E. Rodriguez, "RFI Generation is a Factor . . . " Electronics Magazine (July 1976).

A third class of all-solid state, optically coupled power relays is covered in U.S. Pat. No. 3,996,475. These are simplified units using as few as four components. In particular, they employ photo-resistor light sensors rather than semiconductor sensors. These units do not employ zero-crossover techniques but instead have offered significantly lower cost and in certain cases increased operational versatility.

The prior art ranges across dozens of additional patents for optically coupled solid state switching elements. However, these do not fall into the area of power relays, but instead cover the transfer of signal-level data.

In prior art relative to zero-crossing relay design, it has been the practice to activate a control circuit through optical or transformer means. The output of the control circuit is then typically coupled to either a triac or a pair of inverse parallel SCR's constituting the power switching stage. These approaches commonly employ 15-20 components.

In the case of U.S. Pat. No. 3,524,986, the output switching elements are activated directly by light but the approach therein does not facilitate the zero-crossing feature.

Such a configuration dictates that the SCR's have extremely sensitive gates, generally requiring no more than 1-5 microamperes to trigger, in order to retain responsiveness even with the reduced sensitivity caused by the gate-cathode bias resistors. Such bias resistors are usually employed to prevent spurious triggering of the SCR's in the face of line transients or temperature-induced leakage current increase. Electronics Magazine (July 1976) supra, p. 2.

Furthermore, light activated SCR's available to the trade have, because of their requirement for shallow junction depth to increase sensitivity, tended to be restricted in rating to below 400 volts and 1 ampere because of the manner of silicon chip processing steps.

It is an important object of the present invention to provide a major size reduction in electrical relays with operating capability at several amperes and hundreds of volts.

It is a further object of the invention to provide zero-crossing switching consistent with the preceding object.

It is a further object of the invention to provide improved input/output isolation and reverse polarity protection consistent with one or more of the preceding objects.

It is a further object of the invention to enhance solid state high temperature tolerance, load reliability (at low power factor), and transient immunity consistent with one or more of the preceding objects.

It is a further object of the invention to reduce cost and complexity of solid state relays consistent with one or more of the preceding objects.

SUMMARY OF THE INVENTION

The objects of the invention are realized through a relay construction utilizing light source and light activated switch with a refractive coupling path therebetween. Instead of the traditional light source—light activated switch direct face-to-face coupling arrangement (with attendant capacitance problems) or edge coupled devices (with limited coupling efficiency) there is provided an arrangement wherein a light source chip and light activated chip are set in parallel and preferably in the same plane with indirect face coupling therebetween. A spanning medium over the faces of both chips provides the light reflective conditions for such coupling, preferably in the form of a reflective film dome.

The light emitting and light activated devices of the relay are preferably light sensitive thyristors of power levels. Direct light activation of the power thyristor light activated device (SCR) eliminates conventional bridge circuit or pilot SCR arrangements of the prior art. The light activated thyristors are preferably employed in pairs for alternating half cycle a.c. activation (at zero-crossing going positive and going negative)

with physical separation for significant heat dissipation during inactive cycle portions, and ultimately high temperature tolerance.

Through the present invention, higher current, higher voltage, less sensitive SCR's can be used as both the light sensor and the power switch compared to the prior art. This is achieved through the system of unique coupling optics described above and dynamic biasing of the SCR's. The resultant solid state relay exhibits a number of practical performance advantages over the above referenced prior art as follows:

1. "Zero-voltage" turn-on for the reduction of turn-on radio frequency interference with said turn-on voltage to be within 2 volts of the zero axis and therefore represent a near-ideal condition.
2. Dynamic biasing of SCR's to achieve maximum light sensitivity and yet retain high immunity, over a wide temperature range, to fast-rising voltage transients on output line even without RC snubber networks.
3. Single substrate optical coupling to achieve higher performance and greater ease of manufacture.
4. Lower leakage current.
5. Higher rejection rate of spurious signals on input line.
6. Higher dielectric withstand capability (optical isolation) between input and output.
7. Miniature size.
8. Wider range of operating temperatures.
9. Reduced number of components.
10. Higher power density.
11. Direct light activation of the output power switching elements.

A specific advantage can be seen when the invention is compared to prior art including but not limited to U.S. Pat. Nos. 3,648,075 and 3,723,769, which employ a control circuit to trigger either a triac or pair of conventional SCR's. With such semiconductors as output switches, the bias impedance is fixed either through a built-in resistance as in "shorted-gate" SCR construction or with an external discrete resistor. In order to ensure good rate-effect immunity, the bias resistance must be kept low, typically 47–100 ohms or even lower. This in turn increases the gate trigger current requirement. As a result, at high load impedances; i.e., low load currents, adequate gate current, drawn through the load impedance, can only be realized at the expense of the zero-crossing characteristic. That is, line voltage must be permitted to rise significantly above a few volts in order for adequate gate trigger current to be generated.

In the present invention, the dynamic biasing characteristic of the output switch, by establishing a sensitive "open-gate" condition at the triggering instant, permits near-zero switching even at very low load current conditions.

In a preferred embodiment of the invention, infrared radiation from two series-connected light emitting diodes (LED's) is detected by a pair of inverse-parallel connected silicon controlled rectifiers (SCR's), causing them to switch from a high impedance state (Off) to a low impedance state (On).

Between the cathode and gate of each SCR is an NPN transistor which goes into saturation early in a half cycle and prevents the SCR from being responsive to the light at any time other than the brief instant at the start of the half cycle.

Hence, the two SCR's, and therefore the resultant a.c. switch, can only turn on near the zero axis. If signaled to turn on at other than the zero axis point, the switch (relay) will wait until the next zero-crossing of the sine wave, turn on, and then remain on for subsequent cycles until signaled to turn off by removal of the input signal.

The SCR's, transistors and LED's are placed in chip form on a ceramic substrate on which is deposited appropriate conductive metallization paths and thick-film control resistors.

The entire substrate is coated with transparent material of controlled thickness to create coupling by reflective methods comparable to that in a fiber optic strand.

Other objects, features and advantages of the invention will be apparent from the following detailed description of preferred embodiments thereof, taken in connection with the accompanying drawing, in which,

DETAILED DESCRIPTION OF PREFERRED EMBODIMENTS

Figure 1:
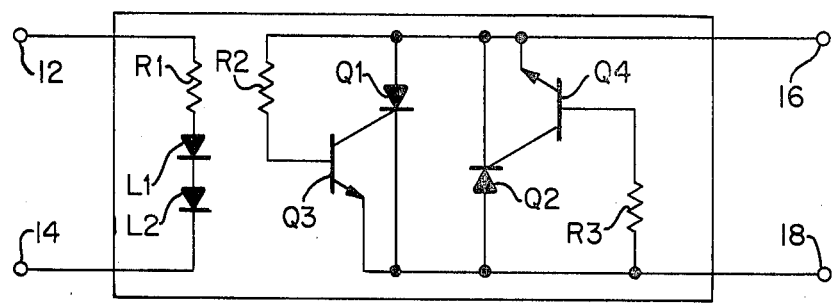
FIG. 1 is a circuit diagram of preferred embodiment of the invention.

FIG. 1 shows a circuit which consists of light emitter L-1 and L-2, light-sensitive output power switches (SCR's), Q1 and Q2 and a network to syncronize turn-on with the voltage sine wave zero-crossing and to minimize false turn-on and including N-P-N transistors Q3 and Q4 and resistors R-1, R-2 and R-3. Input terminals are 12 and 14; output terminals 16 and 18. Commercial light-sensitive SCR's have historically been produced employing relatively shallow-junction chips, the cathode metallization of which has been reduced in contact area to permit greater silicon surface area for light collection. The smaller cathode contact area has decreased the current handling capability. In the present invention, triggering is achieved using relatively deep junctions and full surface cathode metallization so that both blocking voltage and load current capabilities are enhanced.

In operation during the ON state, light-sensitive SCR's Q1 and Q3 are simultaneously turned on early in each half cycle via illumination from L-1 and L-2.

In the absence of an input signal, Q3 is driven into saturation early (a few degrees) into its associated half cycle via current drawn through R2 from the anode line voltage supply. Saturating Q3 essentially short circuits the gate of Q1 for the remainder of the half cycle, thereby making Q1 immune to light triggering.

Saturation of Q4 during the alternate half cycle similarly short circuits the gate of Q2 and prevents activation of Q2.

Collector current for Q1 and Q2 consists of the normal off-state leakage currents of the Q3 and Q4 PNP devices which will never exceed a few hundred microamps, and because signal-type NPN transistors are near their maximum gain at low collector currents, it takes very little Q3 and Q4 base current (a few microamperes) to drive them deeply into saturation.

It can be seen that Q3 and Q4 are essentially "deactivating" Q1 and Q2 very early in each half cycle. However, if light is already present, Q1 and Q2 will turn on before the "deactivation" occurs. Because of the latching properties of the SCR's, they will remain on in a low impedance state for the remainder of the associated half cycle and at the same time remove the source of Q3 or Q4 base drive for the remainder of the half cycle. On the other hand, if light is not available immediately at the half cycle beginning, the inhibit function takes over. Hence Q1 and Q2 can only be turned on near the zero crossing.

In this circuit, with proper selection of R-2 and R-3, the transistors are already moving into saturation when line voltage is at 1 volt, whereas prior art, especially those having a diode bridge in the control circuit, circuits have the inhibit function operating at anywhere from 5 to 15 volts, a level permitting a small degree of RFI generation.

In other words, the invention gives a zero-crossing function approaching the ideal, thereby almost totally eliminating step-function generated RFI.

Normally, a sensitive-gate SCR operated without a bias resistor is extremely sensitive to false triggering. However, as noted from such an SCR, even under open-gate and elevated temperature conditions, has an extremely high dv/dt (transient immunity) rating at applied line voltage under 1-2 volts. (Semiconductor Controlled Rectifiers, William Everitt, Editor, Prentice Hall, 1964.) Below this level, the cathode-gate capacitance acts as a capacitive voltage divider with the anode-gate junction capacitance preventing the internal gate voltage from reaching the required trigger level of approximately 0.5 volts regardless of the steepness of the applied anode voltage wavefront.

In other words, there is a very brief turn on "window" associated with a sensitive gate SCR of the invention where light sensitivity and transient immunity are both at high levels. Turnon within this window also reduces RFI to a near-zero level.

In the majority of prior art designs, which employ diode bridges to establish a DC voltage for the control circuit, the control circuit cannot function until at least the combined voltage drops of the pilot SCR and two of the bridge diodes are overcome; that is, the line voltage must reach at least 3-4 volts, at which point transient susceptibility begins.

Because, as mentioned earlier, the transistors need only minimal base drive, R2 and R3 can be greater than 250 K and therefore guarantee substantially lower off-state leakage current levels for the total relay. It can be noted here that Q3 and Q4 can operate in an open base mode since the normal reasons for transistor biasing do not exist here. That is, the transistors are never operated above a collector voltage of a few volts in a zero-base-current condition where thermal runaway due to leakage is a consideration.

The off-state leakage of SSR's has been a constant source of difficulty for users because of creeping effects with small motors as well as other functions which for safety reasons need to keep leakage to a minimum. For example, a 120 VAC generated leakage current greater than 5 milliamperes represents the threshold of lethal shock for humans.

For almost the entire cycle, having the Q1 and Q2 gates "short-circuited" greatly enhances their high temperature stability and improves their transient immunity. Normally, a high voltage line transient appearing at the SCR anode charges the SCR blocking junction capacitance. This charging current triggers the SCR into false conduction. Q1 and Q2, when saturated, by-pass the charging current around the gate cathode junction to minimize the likelihood of triggering.

As previously noted, the SCR's do not have bias resistors as is normally the case but soon after the beginning of the half cycle retain the stability of heavy biasing because of the early saturation of the transistors in the event a turnon signal is not received.

The overall effect of this scheme is also to widen the temperature range over which the relay can operate; i.e., retains adequate light sensitivity at low temperature but remains adequately insensitive (for stability and transient immunity) at high temperature.

Because this circuit employs inverse parallel SCR's instead of a Triac, it is capable of handling 400 Hz power as well as operating at junction temperatures at least 10-20% above that of Triacs. Triacs are known for their limitations with high power line frequencies, high temperatures and low power factor loads. The improvement is due to the fact that each SCR has a full half cycle for recovery and, even with worsening recovery times at high temperatures, can maintain reliable control.

The source of irradiance for Q1 and Q2 is provided by series LED's L-1 and L-2. Having two LED's provides double the light per unit of current. The additional voltage drop of approximately one volt due to the second LED raises the input threshold level of the relay input to about 2.5 volts. This has no material effect on circuit operation since the logic signals with which the relay is activated are usually no lower than 3 volts.

Because the reverse voltage ratings of the two LED's are additive, the net reverse voltage rating is generally above 25 volts. This makes separate polarity protection diodes unnecessary for relays operating from the conventional IC logic input voltage ranges of 3-24 VDC.

Resistor, R-1, limits LED current to a level adequate for SCR triggering but low enough for direct drive from logic circuits, typically 3-20 mA.

Figure 2:
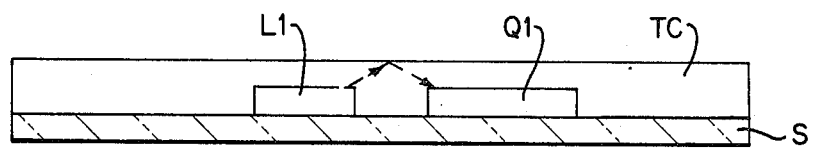
FIGS. 2–4 are cross-section sketches of embodiments of optical coupling arrangements usable in the FIG. 1 circuit or the like in accordance with preferred practices of the present invention.
Figure 3:
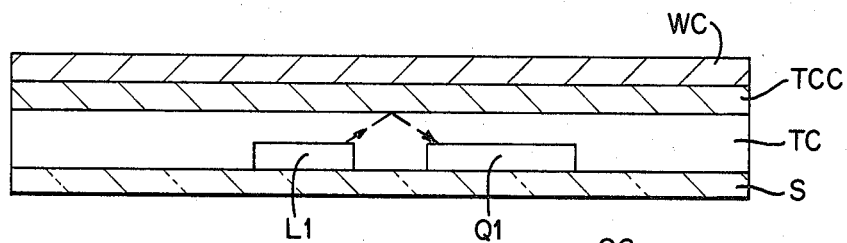
Figure 4:
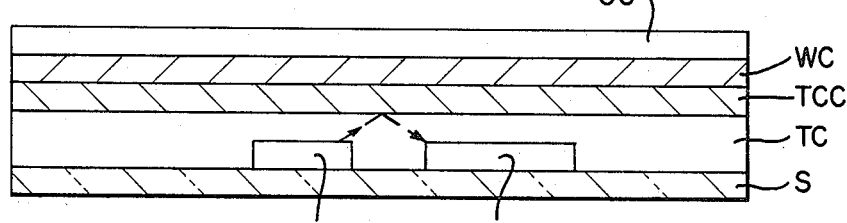

FIGS. 2-4 depict optical coupling arrangements for the FIG. 1 circuit or the like. In all three figures, a high output, liquid-epitaxy infrared emitter chip L-1 is adjacent to the sensor chip Q1, on a ceramic substrate. Note that unlike conventional couplers, both emitter and sensor are on the same substrate; i.e., do not face each other. Irradiance for each sensor SCR chip is primarily from the adjacent LED and partly from the alternate LED.

In practice, the sensor is typically at least 25 mils away from its primary emitter. Unlike face-to-face spacing (and corresponding isolation voltage) which is difficult to control, the FIG. 2-4 arrangement is less vulnerable to problems of mechanical tolerances and thermal expansion effects. This becomes an important yield consideration.

The entire substrate is covered by a thin transparent coating TC typically no greater than 0.030 inch thick.

The location of the chips and the fact that the emitter and sensor chips chosen are optically active at their edges enhance the coupling. The generation of the light within a thin solid transparent medium allows significant transfer of radiation between emitter and sensor by means of refractive (fiber optic) effects.

Figure 5:
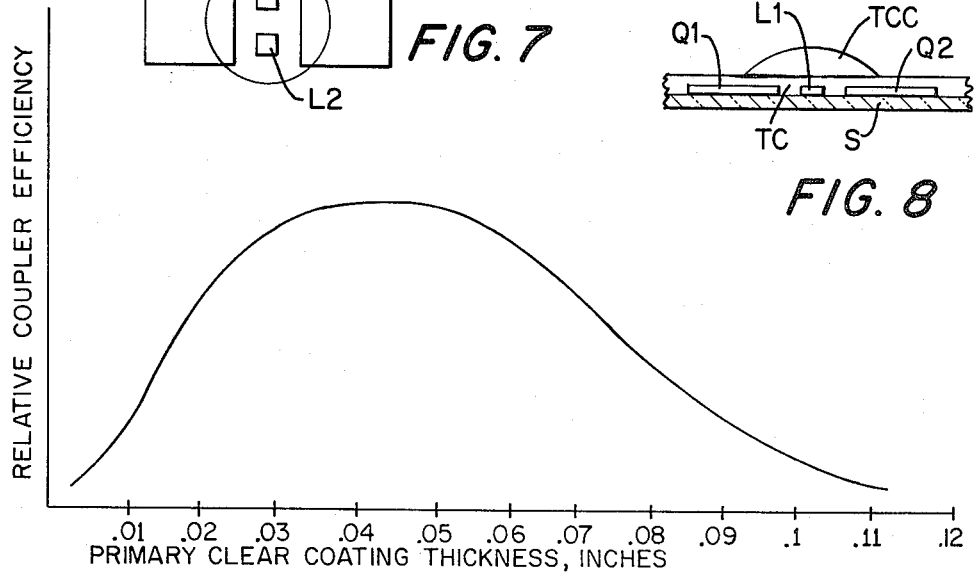
FIG. 5 depicts coupling efficiency as a function of transparent coating thickness for a typical configuration.

When the medium above the coating is air (FIG. 2), light coming off the LED chip at greater than the critical angle (roughly 45 degrees) achieves total internal reflection. If the medium above the first transparent coating is a second transparent coating TCC but of a refractive index at least a few percent lower than the first coating as in FIGS. 3-4, refraction again will generate coupling. (Spotlight on Relays, Electronic News, Apr. 24, 1978.) In the event the clear film is additionally coated with a white coating WC (FIG. 3), reflective rather than refractive effects contribute to coupling. Preferably an opaque coating OC is applied over the white coating (FIG. 4). FIG. 5 depicts coupling efficiency as a function of transparent coating thickness for a typical configuration of the FIG. 4 arrangement. Other aspects of coating cross section are discussed in connection with FIGS. 7-8.

Because of the configuration, dielectric withstand voltage is increased, coupling capacitance is greatly reduced, critical alignment tolerances are eliminated, and coupling efficiency is maintained at a high level.

Although the LED radiation is adequate to trigger the SCR's, it is not adequate to drive the transistors into saturation. Saturating the transistors would of course keep the unit from turning on. As a precaution against transistor saturation from light, Q3 and Q4 are placed on the substrate a substantial distance away from the LED's L-1 and L-2.

In the preferred embodiment, the substrate is totally coated with a thin clear material, then coated with a white material and finally coated with a black material which forms one of the outer surfaces of the relay.

The series of solid coatings enhances heat removal from one side of the substrate during operation with the outer material colored black specifically to improve its emissivity. The intermediate white coating prevents LED radiation absorption which tends to occur should the clear material be coated directly with black material. This need is especially true where the black material has an index of refraction similar to that of the clear.

In summary, the thin clear coating permits optical coupling through reflection or refraction, depending on whether the relay is sealed, respectively, with solid material or by a light-excluding enclosure only.

Figure 6:
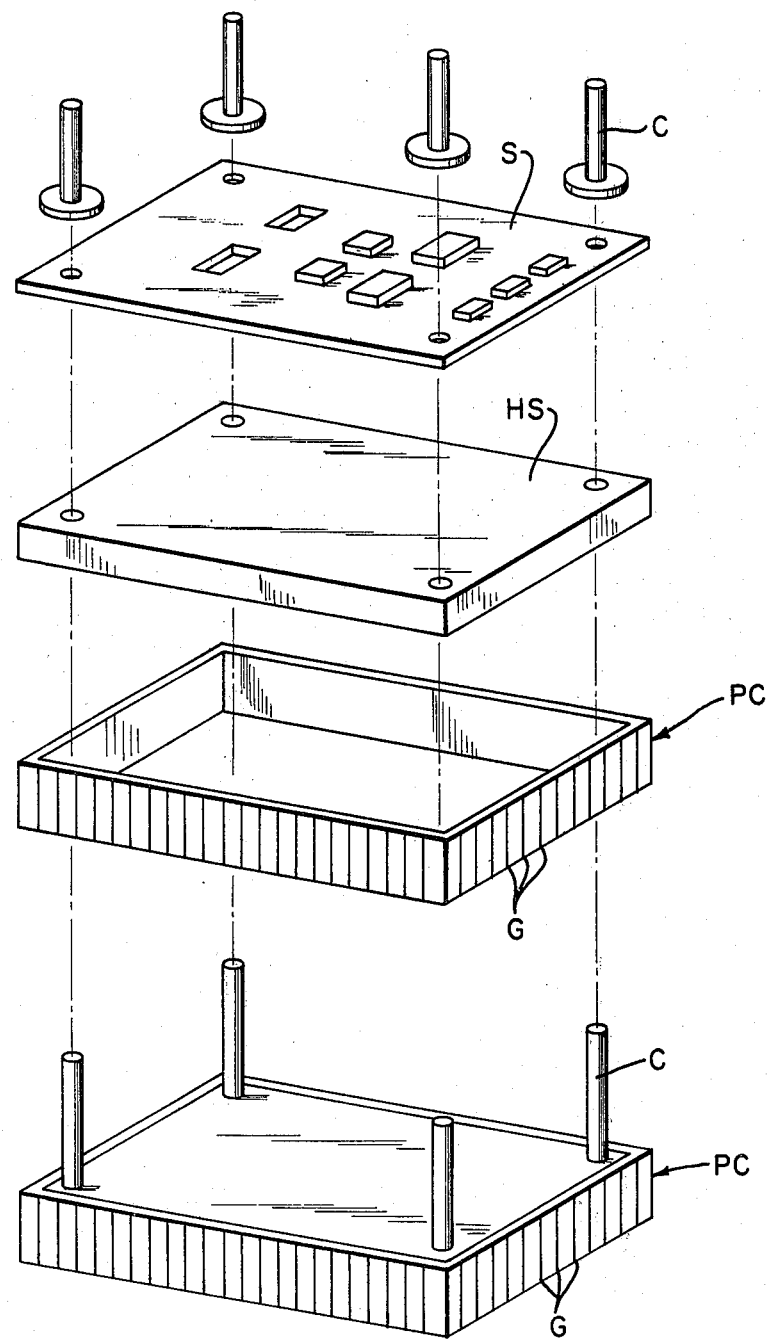
FIG. 6 depicts the packaging of the preferred embodiment of the invention in exploded isometric form.

FIG. 6 depicts the packaging of the preferred embodiment of the invention in exploded isometric form. In addition to the circuit elements and optical coupling arrangement previously described, the unit incorporates an integral heat sink HS bonded to one side of the substrate. The heat sink consists of an aluminum block whose total surface area serves to decrease the steady state thermal resistance path between the power chips and the ambient. The block is specifically made thicker than the substrate to greatly reduce the transient thermal impedance and thereby significantly increase the short duration current overload capability. A two-part plastic molded case PC is designed with many shallow surface grooves G which serve to increase air turbulence immediately adjacent to the case, thereby creating convection cooling effects to complement the primary mode of heat removal through radiation cooling. Connectors are shown at C.

Figure 7:
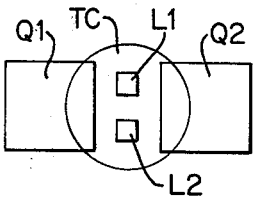
FIGS. 7–8 are top and cross section views of preferred realizations of coating for the FIG. 2–4 embodiments.
Figure 8:
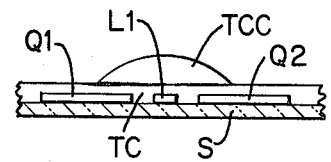

In the simplest form, single infrared LED's were mounted on a substrate with a pair of sensitive gate SCR's mounted on either side, as seen in FIGS. 7-8, (FIGS. 2-4), if sensitive enough and irradiated with an LED drive of 20-30 mA, could be triggered with LED/SCR distance as far as ⅛ inch as long as a clear coating at least 0.030" thick were over the chips. The first tests used Xciton CXC-1212 LED's and Unitrode 1P102 type, 0.75 amp-rated SCR chips. Tests with comparable results were conducted with Teccor sensitive gate SCR chips rate at 10 amps.

To achieve such triggering by lateral light coupling, it was observed that the SCR's needed to have gate trigger currents generally under 25 microamps. The responsiveness seemed to be unrelated to the chip size (Unitrode chip was 0.030 by 0.030 and Teccor chip was 0.125 by 0.125).

In general, it made little difference in light coupling whether the clear coating were silicone, epoxy or distilled water.

Dome formation of the transparent coating was found to be important to effective coupling. Preferably the dome is over the light source and tapers down, nonhemispherically to a mid-point(s) of the SCR(s). Different coating thicknesses were tried along with observations as to the effect of coating the clear coating with a white material. The results were generally that a dome maximum height of 10-30 mils (to 40 with a white overcoating) provided highest coupling efficiency.

Tests were conducted with a smaller LED, Xciton brand liquid epitaxy CXC1210, a 0.010" by 0.012" chip. It is very small, tending to be inexpensive and is a "N" top device, which generally permits a more reliable ultrasonic wire bond on the top of the chip. ("P" top LED chips tend to be more difficult to bond.) The liquid epitaxy chip was chosen instead of the diffused-junction type common to most commercial couplers since it is generally agreed in the industry that liquid-epitaxy types have higher outputs and have considerably lower long-term light degradation, particularly at elevated temperatures.

In terms of choosing an SCR, the sensitive Unitrode chip was acceptable, but only for low current (under 1 amp) and low voltage (under 200 volts). A Teccor chip, while adequate in terms of voltage and current, was actually greater than needed and slightly more expensive and had no second source. Hence, a chip somewhat between the two was needed. The General Electric C106 type sensitive gate SCR chip (approximately 0.060 by 0.060 inches) and the Motorola equivalent, MCR106 (approximately 0.070 by 0.070) were chosen as the preferred candidates to be the power switch. These chips met the current rating needs (about 4-5 amps per SCR), were readily available at low cost, were wirebondable (a desirable manufacturing characteristic) and were available with voltage ratings to 600 volts and above.

However, the GE and Motorola produce these chips in a manner that tends to leave a less sensitive gate than the above Unitrode and Teccor chips. The distrubtion of trigger currents of the gate currents of the preferred candidates is between 5 microamps and 30 microamps.

For low cost, it is necessary then the produce an optical coupling scheme which can use SCR chips which fall anywhere within the chip maker's distribution, thereby eliminating costs of special selection. It was found that a single CXC1210 or CXC1212 type LED could require as much as 30-50 mA to trigger the SCR if the SCR had a gate trigger current at the high end of the distribution, such as 25 microamps.

Employing two CXC1210 LED's in series reduced the required current for triggering to 15-25 mA. However, commercial specification requirements and the need for high manufacturing yields dictate that the majority of SCR's be capable of triggering with an LED current in the 10 mA range.

Coupling effects were studied for SCR and LED positions. It was found that rotating the SCR 360 degrees seemed to have no particular bearing on sensitivity relative to picking up radiation from an LED near one edge. As a result, the relative gate/cathode positions have been chosen to facilitate easiest wire bonding rather than due to any sensitivity factor.

It was determined that the best sensitivity is as in FIGS. 7-8 where the two LED's sit between the two SCR's. In addition, with a rectangular chip as the CXC1210, having the long side face the SCR's has a 10-15% improvement over a 90 degree-rotated position.

In practice, the SCR chips may be placed approximately 0.020 inch from the LED's (edge to edge). This offers tight coupling without sacrificing dielectric isolation.

Cross-sectional geometry is a critical factor, from both a manufacturing standpoint and a practical coupling efficiency standpoint.

With the domed arrangement of FIGS. 7-8 discussed above, optical coupling and relay operation can be achieved with a film as thin as 4-5 mils covering LED and SCR chips.

A two-part heat curable flexible silicone material, e.g., Dow Sylgard brand #184, was preferred as the clear material TC/TCC. It is essentially non-yellowing with age and temperature and because of its flexibility does not stress chip wire bonds during cure or temperature excursions as might an epoxy resin. Silicone is widely regarded as a desirable semiconductor coating whatever the application.

A disadvantage was discovered, however, in that the silicon is essentially available only as a very low viscosity, low surface tension liquid. As a result, forming a small, low dome is very difficult since a drop quickly spreads out to a flat film, unlike a higher viscosity epoxy which can be deposited as a drop which retains a near hemispherical shape.

It was found, however, that the tendency of a drop of the silicone to spread is diminished if the initial surface is first coated with a film of cured 184 no greater than 1-3 mils thick. It was further found that a small drop of 184, deposited on any surface pre-set at about 100° C., will essentially "freeze" or partially cure when it hits the surface.

To prevent the drop from instant freezing (since that would create a hemispherical dome which tends to be too high) the substrate is first coated with a thin 184 film of 1-3 mils. This pre-coat, along with heating the substrate to about 70 degrees, alows a later deposited 184 drop TCC which flattens and spreads slightly, but only to a controlled and predictable degree. The optimum dome TCC is about 0.10 inch in diameter at its base and between 0.020-0.030 high.

The coating TC/TCC is overcoated with a white coating. Then the relay as a whole is encapsulated with an opaque, usually black, epoxy. Tests have shown that encapsulating with black epoxy creates significant light absorption at a silicone/epoxy interface unless the silicon is first coated with a white material. The white coating needs to be relatively thick, on the order of 0.015-0.020 inch, in order to prevent infrared light absorption by the subsequent black encapsulant.

It is important to note that the worst-case sensitivity SCR's (about 25-30 microamp gate sensitivity), improper dome shape, inadequate white coating or LED chip angular orientation are individually capable of preventing proper relay operation. Hence, the need exists for tight control of all steps.

SCR's with gate sensitivities under 3-4 microamps have dramatically different considerations; only a single LED is required and dome shape is not critical for these. Triggering of the SCR's has been achieved with LED currents as low as 1 mA with LED and SCR 0.090 apart and covered by an 0.030 clear film over the entire substrate (no dome shaping).

In a further test, a 2N2222 transistor chip was placed approximately ½ inch away from a single LED and the substrate coated with a 0.030 inch clear silicone film. The transistor could be driven into saturation (under 0.5 vilts) at a collector current of 200 microamperes with an LED current of 25 mA. This test was done to prove the ability of the thin clear film to transfer light by multiple internal reflections over a distance as in a fiber optic stand.

Chip attachment of LED devices to the substrate is made with a conductive silver containing epoxy such as Epotek H-31. It is extremely important that no epoxy spread up the sides of the LED devices. This can degrade the reverse blocking characteristic of the diode, which may or may not be important in individual applications. However, epoxy on the junction can shunt current around the light producing junction thereby greatly degrading light output.

Tests have been conducted with very small epoxy chip-attachment dots (under 0.010 in diameter) to prevent edge leakage. Also evaluated has been a very low viscosity (water like) epoxy (DuPont 5805). This electrically conductive epoxy can be deposited as a very small dot which spreads to a very thin film which does not creep up the edge of the LED. For this reason silver epoxy is employed with consistently good electrical results without the danger of voids in a solder interface which can occur under certain conditions. With chips under 0.10 by 0.10 inches, such voids appear to have serious effect on thermal resistance and forward voltage drop. A larger chip would be more forgiving of a small void.

The substrate metallization is platinum-silver alloy, chosen for its low cost, high electrical conductivity solderability, and compatibility with ultrasonic wire bonding. Conductive patterns are scrrrned onto the substrate with a wider-than-normal mesh to result in a thicker layer. This helps to reduce voltage drops which, although small, are undesirable but unavoidable at currents of several amperes.

Connections to the LED's, transistors and SCR's are made by ultrasonically bonding aluminum wires between the chip top surfaces and the substrate. These wires range from 1.0 to 5 mils in diameter. Generally, these chips have gold or platinum top contact areas. In certain cases, however, as with the Teccor 0.125 by 0.125 SCR chip, the top and bottom contacts may be solder coated.

To circumvent the difficulty ultrasonically bonding an aluminum or gold wire to a solder coated metal, one can fabricate small 0.010 thick aluminum discs (0.030 to 0.060 diameter). These are bonded to the solder coated cathode and gate pads of the SCR with silver epoxy. It is then possible to readily bond a wire ultrasonically to the aluminum discs.

The fact that most low cost power semiconductor chips have been available only in solderable form has constituted a major obstacle in products where ultrasonic bonding has been preferable. The use of the aluminum discs—a new technique—eliminates this restriction.

The transistor drive resistors represent a special consideration since they see line voltage during the relay off condition. It is not generally known that some thick film resistor materials exhibit decreasing resistance when subjected to an excessive voltage gradient over their length. It has been observed that a one megohm resistor immediately drops to 500 K when subjected to 400 volts. This was a resistor approximately 0.040 inch long with a material rated for about 4 volts per mil.

Surge Current Considerations

In the circuit of FIG. 1 it was found that the 47 ohm resistors had to be added between transistor collectors and SCR gates to prevent a particular failure mechanism. When a.c. power is first applied, a momentary transient load current (lasting no more than a few hundred microseconds) can occur due to the SCR junction capacitance permitting a short duration low impedance. This transient current may not trigger the SCR into false conduction but nevertheless, becomes the collector current for the transistor shunting the SCR gate.

If the a.c. power happens to be applied at the sine wave peak and if the load is a tungsten lamp with its attendant low cold-filament resistance, a current spike of many amperes can result. If the transistor is a small signal type, as chosen herein for economic reasons, the multi-ampere pulse will destroy the transistor. With a 100 watt bulb (cold filament resistance of about 7 ohms) and sine wave peak voltage of about 165 volts, it is theoretically possible to approach a peak current of nearly 25 amperes although actual values do not usually go this high.

As a result, the 47 ohm resistor was chosen as R-2 and R-3 to be large enough to limit peak current to 3–4 amperes but small enough so as not to interfere with the transistor's ability to act as a low gate-to-cathode impedance when saturated. The gate-cathode impedance is the sum of the series surge-limiting resistance and the dynamic saturated resistance of the transistor. A value of R above 100 ohms would start to negate the transistor's effect. While values of 22 ohms also limited surge, a value of 47 ohms offers a better safety margin without sacrificing transistor performance. Generally, almost any type of small or medium power NPN transistor could function as the zero crossing transistor if the drive resistor were dropped to 250 K ohms.

However, it is desired to keep the drive resistor above 1 megohm as a way to limit relay off-state leakage current and meet a much more desirable commercial specification criterion.

Using 1 to 2 megohms (less base drive) resulted in tests for many transistors, in the failure of the SCR's to block at high temperatures. This was because as the leakage of the SCR's increases at high temperatures, the transistor (which has the leakage current as its collector current) must remain hard in saturation.

Rather dramatic differences were found among various transistors operating at 125° C. in their ability to keep SCR gates biased down and hence keep the SCR's in a blocking state. At times, different effects were observed between two transistor types even though on a Tektronix 575 curve tracer, they seemed to have similar characteristics. It was felt that individual sotred charge, switching speed and capacitance anomolies accounted for the differences.

Several minor experiments were conducted which tended to bear out these assumptions although not conclusively. Circuits were constructed connecting NPN transistors in an inverted (backwards) configuration since it has been observed that such a connection can provide extremely low saturation voltages.

While excellent for high temperature results, the low inverse gain (less than one) required a 100 K–250 K ohm maximum control resistor to generate adequate base drive and this is unacceptable. Using a standard transistor with a diode connected between its emitter and base helped somewhat (diode cathode to transistor base), but was costlier. It was found that an MOS field-effect transistor could provide very low transistor ON impedance with extremely small control drive (control resistor as high as 10 megohm) and maintain this condition at temperatures up to 150° C. The use of such an MOS transistor appears promising but represents greater expense and cure must be taken to avoid possible voltage-breakdown of the gate-to-source interface under operating conditions.

Several commercial 2N2222 type NPN transistors offered the best combination of low saturation voltages at low currents, 125° C. operation and low cost. Several 2N2222 types, from Motorola, Raytheon and National seemed to exhibit better in-circuit performance than other transistors which, on a curve tracer, seemed to be better, including a Motorola MPS-U02. The 2N2222, of course, is a smaller chip. It is faster and has less capacitance. An incircuit evaluation of the transistor is critical to high performance relay operation even though there are indicators as to what the transistor parameters should be.

SCR leakage increases at elevated temperature. It is known that a transistor such as the 2N2222 will exhibit an increase in gain at low collector currents as temperature increases. If the SCR's are elevated to 125° C. but the transistors are maintained at 25°, the transistors will "run out of gain" and be unable to shunt the increasing leakage and thereby allow the SCR to self-trigger on its own leakage.

It is important then to make use of the fact that the transistor chips are mounted on the same substrate as the SCR's. As long as the transistors get hot and track thermally as well, their gain will increase and permit them to continue to shunt the increasing SCR leakage around the gate.

The SCR's do get more sensitive to light at elevated temperatures. However, the LED's, being mounted right between the SCR's, are heated as well and have a decrease in light output at a faster rate than the increasing SCR sensitivity. The result is that the relay tends to acquire about 5–10% more input (LED) current to operate at 100°–125° C. than at room temperature. This small loss of sensitivity should be allowed for by an adequate safety factor in the optical coupling efficiency rating.

A pair of 0.070 by 0.070 SCR chips are epoxy bonded to a 0.025 inch thick 0.4×0.8 inch 96% alumina substrate which is in turn bonded with Dow Sylgard 184 to a 0.4 b6 0.8 inch, 0.10 inch thick aluminum block. This configuration is then placed in a 0.875 by 0.5 by 0.250 plastic case and epoxy filled. Thermal resistance from SCR junctions to the surrounding air has been calculated to be under 40° C./watt. The SCR junction-toaluminum thermal resistance has been calculated to be under 6° C. per watt. Soldering the chips to the substrate often does not provide as good a figure because of voids in the solder.

In cases where the chips must be soldered, the chip must be pressed against the substrate during heat application to eliminate voids. It should be noted here that there is a third and widely used method to attach chips to a substrate. Called eutectic bonding, the process involves taking a gold backed chip and scrubbing it onto a gold metallization pad at about 450° C. This process is expensive and restrictive in terms of the kinds of chips and substrates the process allows.

Also, it has been found to be important that the alumina substrate be in very intimate contact with the aluminum.

Despite thermal resistance calculations, verifications should be made by operating devices under controlled conditions in room temperature air and in environmental test ovens. Power dissipation and temperature rise measurements can be made with functional relays. Tests are also conducted with termally calibrated diodes mounted on the relay substrate. It is well known in the semiconductor industry that the forward voltage drop of a silicon diode will change in a predictable manner with temperature. A diode calibrated in this way in an oven can then be used to achieve a precise thermal resistance measurement at a given power since the junction temperature can be determined by observing the calibrated voltage drop.

A 1 mil aluminum wire is preferably used for the LED's, the base and emitter of the transistors, and the gate of the SCR's. A pair of 3 mil wires is used on each SCR cathode to assure at least a 406 amp steady state rating and well over a 75 amp incandescent lamp cold-filament surge current. It has been confirmed empirically that encapsulating the chips increases the current handling range of the wires by 25% over free air.

While gold wire would increase the current handling of the wires by another 25-50%, gold wires are not thought of as being preferred for ultrasonic bonding when compared to aluminum wires. Gold wire is usually attached today with thermo-compression bonding. It is preferred to stay with a single, low cost, versatile, aluminum, ultrasonic approach.

The design of the relay is such that only a brief window exists early in the half cycle when the SCR's are capable of being triggered. With inductive loads (low power factor), the widening phase angle difference between voltage and current can prevent the SCR's from responding to a turn on signal until the turn on angular window is over or nearly over. Under such case, the LED's would have to be driven with 2 or 3 times the current to overcome the inhibiting function of the zero-crossing detector transistors.

With very low power factor loads, such as 0.2 or lower, the phase angle difference is so great that the relay simply will not turn on.

An application has been encountered in which a 120 VAC contactor coil is being driven. The inductance of the coil is several henries. A normal relay would not operate unless the LED's were driven harder. It was found that simply connecting a capacitor as small as 0.022 mfd. across the solid state relay output terminals corrected the circuit phasing and restored perfectly normal operation.

The most popular general purpose integrated circuits today are characterized as TTL logic families. The devices usually desired for driving small relays and displays are typically specified as being able to sink 16 mA. This means that it is very deisrable, although not absolutely necessary to have a solid state relay capable of operation when driven by no more than 16 mA. By creating a unit which is designed to operate on as little as 10 mA although typically run at 16 mA, long term degradation is minimized consistent with a safety factor should degradation occur. Finally, it should be noted that the use of two LED's means that the effect of somewhat faster degradation in one LED is halved in terms of overall effect on the coupler as compared to a circuit with only one LED.

It is evident that those skilled in the art, once given the benefit of the foregoing disclosure, may now make numerous other uses and modifications of, and departures from the specific embodiments described herein without departing from the inventive concepts. Consequently, the invention is to be construed as embracing each and every novel feature and novel combination of features present in, or possessed by, the apparatus and techniqucs herein disclosed and limited solely by the scope and spirit of the appended claims.

What is claimed is:

1. Zero crossing a.c. power relay operable at several amperes and hundreds of volts, with optical isolation comprising, in a common plane,
   at least one photosensitive SCR and at least one solid state junction light emitter optically coupled, from emitter face to SCR face,
   the emitter and SCR being of planar form and housed in a common optical transmitting solid medium in substantially parallel and edge by edge relationship such that the emitter face does not directly oppose the SCR face,
   the medium comprising a non-hemispherical surface dome over the emitter face and SCR face which is reflective,
   control means for the SCR limiting its turn on to within 2 volts.

2. Zero crossing a.c. power relay with optical isolation in accordance with claim 1 wherein two such physically separate scr's and two such light emitters are provided, the SCR's being electrically connected to provide output a.c. on alternate half cycles and light emitters being connected in electrical series to the a.c. input.

3. Zero crossing a.c. power relay with optical isolation in accordance with either of claim 1 or 2 wherein each SCR is dynamically biased by an NPN transistor connected between SCR cathode and gate and selected and arranged so that the transistor becomes saturated early in its half cycle thereby preventing the SCR from being triggerable by light for the remainder of the half cycle.

4. Zero crossing a.c. power relay with optical isolation in accordance with claim 3 in which an unbiased high gain NPN transistor is the saturating element, SCR leakage current serves as the transistor collector current, and the transistor, even with relatively high values of base-current limiting resistors, is capable of saturating at line voltages virtually no higher than the transistor emitter-base diode knee voltage.

5. Zero crossing a.c. power relay with optical isolation in accordance with either of claim 1 or 2 in which the apparatus is constructed and arranged to trigger each SCR into conduction before its associated transistor saturates and by-pass light induced potential trigger current around the SCR cathode gate junction.

6. Zero crossing a.c. power relay with optical isolation in accordance with either of claim 1 or 2 in which circuit components are mounted in the form of chips or films on a thin, coated ceramic substrate which is in turn bonded to a relatively thick metal plate, said substrate, plate, and substrate coatings being configured to minimize both the steady state and transient thermal impedances.

7. Zero crossing a.c. power relay with optical isolation in accordance with claim 1 wherein the optical path controller comprises a second medium having a lower index of refraction than the said common medium of SCR and light emitter.

8. Zero crossing a.c. power relay with optical isolation in accordance with claim 1 and further comprising, heat transfer means significantly utilizing thermal conductivity of both said common medium and of said optical path controller to remove heat from each SCR.

9. Zero crossing a.c. power relay with optical isolation in accordance with claim 1 wherein the medium is a clear dome form coating with maximum height over the light emitter and tapering down towards the SCR face mid-region.

10. Zero crossing a.c. power relay with optical isolation in accordance with claim 9 wherein the dome maximum height is 10–30 mils and the dome form is non-hemispherical.

11. Zero crossing a.c. power relay with optical isolation in accordance with claim 10 wherein the dome comprises a two part form of thin base layer and thicker domed form top layer thereon, the said base substantially completely covering the light emitter and SCR elements.

12. Zero crossing a.c. power relay with optical isolation in accordance with claim 10 wherein at least one light emitter is arranged between two SCR's.

13. Zero crossing a.c. power relay with optical isolation in accordance with claim 10 wherein the clear coating is overcoated with reflective coating and the relay as a whole is encapsulated in an opaque high emissivity medium, the reflective coating being sufficiently thick to substantially overcome the tendency of the encapsulant to absorb the light emitter's output in the region of the clear coating providing emitter-SCR optical coupling.

14. The claim 1 relay product as made by placing said emitter and SCR on a common substrate and overlaying them with a resin selected and controlled to minimize surface tension to create a non-hemispherical dome of such resin optically coupling the emitter and SCR.

* * * * *